United States Patent
Lin et al.

(10) Patent No.: US 9,634,083 B2
(45) Date of Patent: Apr. 25, 2017

(54) SEMICONDUCTOR STRUCTURE AND PROCESS THEREOF

(71) Applicant: UNITED MICROELECTRONICS CORP., Hsin-Chu (TW)

(72) Inventors: Chien-Liang Lin, Taoyuan County (TW); Yu-Ren Wang, Tainan (TW); Ying-Wei Yen, Miaoli County (TW)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 21 days.

(21) Appl. No.: 13/710,382

(22) Filed: Dec. 10, 2012

(65) Prior Publication Data

US 2014/0159211 A1  Jun. 12, 2014

(51) Int. Cl.
*H01L 21/20* (2006.01)
*H01L 29/06* (2006.01)
*H01L 21/441* (2006.01)
*H01L 21/02* (2006.01)
*H01L 21/3105* (2006.01)
*H01L 21/3115* (2006.01)
*H01L 21/28* (2006.01)
(Continued)

(52) U.S. Cl.
CPC ...... *H01L 29/0603* (2013.01); *H01L 21/0234* (2013.01); *H01L 21/02164* (2013.01); *H01L 21/02332* (2013.01); *H01L 21/02337* (2013.01); *H01L 21/28202* (2013.01); *H01L 21/3105* (2013.01); *H01L 21/31155* (2013.01); *H01L 21/441* (2013.01); *H01L 29/4966* (2013.01); *H01L 29/51* (2013.01); *H01L 29/513* (2013.01); *H01L 29/66545* (2013.01); *H01L 29/78* (2013.01)

(58) Field of Classification Search
CPC .. H01L 21/28158–21/28211; H01L 21/02164; H01L 21/3105; H01L 21/324; H01L 31/186–31/1868; H01L 33/0095; H01L 2224/35848; H01L 2224/80035; H01L 21/02323; H01L 21/02337
See application file for complete search history.

(56) References Cited

U.S. PATENT DOCUMENTS 5,296,411 A  3/1994  Gardner
5,591,681 A  1/1997  Wristers
(Continued)

OTHER PUBLICATIONS

Alfred H. White and Wm. Melville, "The decomposition of ammonia at high temperatures", Journal of The American Chemical Society, Apr. 1905, 27 (4), pp. 373-386.*

*Primary Examiner* — Cuong B Nguyen
(74) *Attorney, Agent, or Firm* — Winston Hsu; Scott Margo (57) ABSTRACT

A semiconductor structure includes a dielectric layer located on a substrate, wherein the dielectric layer includes nitrogen atoms, and the concentration of the nitrogen atoms in the dielectric layer is lower than 5% at a location wherein the distance between this location in the dielectric layer to the substrate is less than 20% of the thickness of the dielectric layer. Moreover, the present invention provides a semiconductor process including the following steps: a dielectric layer is formed on a substrate. Two annealing processes are performed in-situly on the dielectric layer, wherein the two annealing processes have different imported gases and different annealing temperatures.

12 Claims, 7 Drawing Sheets

(51) Int. Cl.
  *H01L 29/49* (2006.01)
  *H01L 29/51* (2006.01)
  *H01L 29/66* (2006.01)
  *H01L 29/78* (2006.01)

(56) References Cited

U.S. PATENT DOCUMENTS

| | | |
|---|---|---|
| 6,110,842 A | 8/2000 | Okuno |
| 6,165,846 A | 12/2000 | Carns |
| 6,245,689 B1 | 6/2001 | Hao |
| 6,268,251 B1 | 7/2001 | Zhong |
| 6,358,865 B2 | 3/2002 | Pearce |
| 6,461,984 B1 | 10/2002 | Han |
| 6,492,217 B1 | 12/2002 | Bai |
| 6,548,366 B2 | 4/2003 | Niimi |
| 6,555,485 B1 | 4/2003 | Liu |
| 6,590,344 B2 | 7/2003 | Tao |
| 6,627,463 B1 | 9/2003 | Sarfaty |
| 6,632,747 B2 | 10/2003 | Niimi |
| 6,639,264 B1 | 10/2003 | Loh |
| 6,649,538 B1 | 11/2003 | Cheng |
| 6,667,251 B2 | 12/2003 | McFadden |
| 6,706,644 B2 | 3/2004 | Burnham |
| 6,723,663 B1 | 4/2004 | Wieczorek |
| 6,737,362 B1 | 5/2004 | Chen |
| 7,091,119 B2 | 8/2006 | Colombo |
| 7,138,691 B2 | 11/2006 | Burnham |
| 7,176,094 B2 | 2/2007 | Zhong |
| 7,186,608 B2 | 3/2007 | Moore |
| 7,429,538 B2 | 9/2008 | Olsen |
| 7,981,808 B2 | 7/2011 | Luo |
| 2002/0190302 A1 | 12/2002 | Bojarczuk, Jr. |
| 2003/0057432 A1* | 3/2003 | Gardner et al. ............. 257/100 |
| 2003/0109146 A1 | 6/2003 | Colombo |
| 2004/0029328 A1 | 2/2004 | Lahaug |
| 2004/0070046 A1 | 4/2004 | Niimi |
| 2005/0003618 A1 | 1/2005 | Kanda |
| 2005/0064109 A1 | 3/2005 | Chen |
| 2005/0130442 A1 | 6/2005 | Visokay |
| 2005/0164445 A1* | 7/2005 | Lin et al. ................. 438/240 |
| 2006/0148179 A1 | 7/2006 | Wang |
| 2006/0172473 A1 | 8/2006 | Cheng |
| 2006/0172554 A1 | 8/2006 | Wang |
| 2006/0194423 A1 | 8/2006 | Lim |
| 2006/0194446 A1 | 8/2006 | Beaman |
| 2006/0246739 A1 | 11/2006 | Wang |
| 2006/0280876 A1 | 12/2006 | Yen |
| 2007/0072364 A1* | 3/2007 | Visokay et al. ............. 438/240 |
| 2007/0082445 A1 | 4/2007 | Yang |
| 2007/0082503 A1 | 4/2007 | Wang |
| 2007/0093013 A1 | 4/2007 | Chua |
| 2007/0169696 A1 | 7/2007 | Olsen |
| 2008/0090425 A9 | 4/2008 | Olsen |
| 2008/0200000 A1 | 8/2008 | Minakata |
| 2010/0081290 A1 | 4/2010 | Luo |
| 2010/0230757 A1 | 9/2010 | Chen |
| 2011/0204454 A1* | 8/2011 | Chambers et al. ........... 257/411 |
| 2013/0306975 A1* | 11/2013 | Levy et al. ................. 257/66 |

\* cited by examiner

SEMICONDUCTOR STRUCTURE AND PROCESS THEREOF

BACKGROUND OF THE INVENTION

1. Field of the Invention

The present invention relates generally to a semiconductor structure and a process thereof, and more specifically to a semiconductor structure and a process thereof that performs two in-situ annealing processes on a dielectric layer.

2. Description of the Prior Art

Poly-silicon is conventionally used as a gate electrode in semiconductor devices, such as the metal-oxide-semiconductors (MOS). With the trend towards scaling down the size of semiconductor devices, however, conventional poly-silicon gates face problems such as inferior performances due to boron penetration and unavoidable depletion effect. This increases the equivalent thickness of the gate dielectric layer, reduces the gate capacitance, and worsens a driving force of the devices. Therefore, work function metals are used to replace the conventional poly-silicon gate to be the control electrode, and to form metal gates.

Dielectric layers are needed in a polysilicon gate or a metal gate, and the dielectric layers are respectively located between polysilicon and a substrate, or between a metal and a substrate. In general, the dielectric layer of the polysilicon gate is an oxide layer, and the dielectric layer of the metal gate may include a buffer layer or a dielectric layer having a high dielectric constant etc. As semiconductor components shrink, the requirements for the size and the material properties of the dielectric layer become critical. Thus, it becomes an important issue to know how to form a dielectric layer that can approach the desired electric performances or how to improve a processing efficiency and reduce processing costs in the semiconductor industry.

SUMMARY OF THE INVENTION

The present invention provides a semiconductor structure and process thereof, which performs two in-situ annealing processes having different imported gases and different annealing temperatures on the dielectric layer, to improve the processing efficiency and the electrical performances of the formed semiconductor structure.

The present invention provides a semiconductor structure including a dielectric layer located on a substrate, wherein the dielectric layer comprises nitrogen atoms, and the concentration of the nitrogen atoms in the dielectric layer is lower than 5% at a location wherein distance between the location in the dielectric layer to the substrate is less than 20% of the thickness of the dielectric layer.

The present invention provides a semiconductor process including the following steps. A dielectric layer is formed on a substrate. Two annealing processes are performed in-situly on the dielectric layer, wherein the two annealing processes have different imported gases and different annealing temperatures.

According to the above, the present invention provides a semiconductor structure and a process thereof, which performs two in-situ annealing processes on a dielectric layer, and the two annealing processes have different imported gases and different annealing temperatures. In this way, the dielectric layer and a substrate can be repaired effectively by performing the two annealing processes having different imported gases and different annealing temperatures, and a circuit leakage density (Jg) is therefore reduced. Moreover, only one single pre-heating or heating step is performed as the two annealing processes having different imported gases and different annealing temperatures are performed, thereby shortening the processing time of the two annealing processes. Besides, the dielectric layer of the present invention pollution due to transfers into different processing chambers for performing the two annealing processes will not occur because the two annealing processes are performed in the same processing chamber.

The semiconductor structure formed by the semiconductor process of the present invention has a dielectric layer including nitrogen atoms, and the concentration of the nitrogen atoms in the dielectric layer is lower than 5% at a location wherein the distance between the location in the dielectric layer to the substrate is less than 20% of the thickness of the dielectric layer. Therefore, pollution and damages of the substrate caused by plasma or dopants can be reduced, and the reliability of the formed semiconductor structure can be improved.

These and other objectives of the present invention will no doubt become obvious to those of ordinary skill in the art after reading the following detailed description of the preferred embodiment that is illustrated in the various figures and drawings.

DETAILED DESCRIPTION

FIGS. 1-4 schematically depict cross-sectional views of a semiconductor process according to an embodiment of the present invention. A shown in FIG. 1, a substrate 110 is provided. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. A dielectric layer 120 is formed on the substrate 110. The dielectric layer 120 may be a silicon oxide layer, a silicon oxynitride layer or a hafnium oxide layer or a combination thereof, but it is not limited thereto. The semiconductor process of the present invention is suited for being applied in gate processes such as in a polysilicon gate process, a gate last process or a gate first process, wherein the gate last process includes a gate last process for buffer layer first and High-K first process, a gate last process for buffer layer first and High-K last process, or a gate last process for buffer layer last and High-K last process etc. Thus, the dielectric layer 120 of the present invention may be a gate dielectric layer, a buffer layer or a dielectric layer having high dielectric constant, but it is not limited thereto. In this embodiment, the dielectric layer 120 is a gate dielectric layer, and the semiconductor process in this embodiment is a polysilicon gate process. Besides, the dielectric layer 120 is a silicon oxide layer, which may be formed through an in situ steam generated (ISSG) process or a dry oxidation process, but it is not limited thereto.

Figure 1:
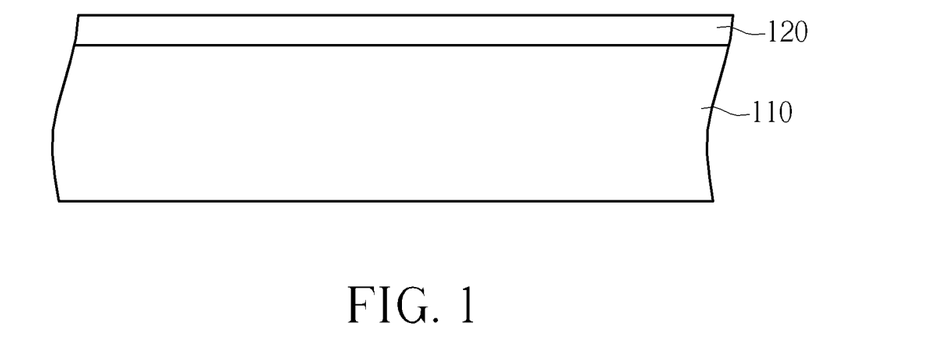
FIGS. 1-4 schematically depict cross-sectional views of a semiconductor process according to an embodiment of the present invention.
Figure 2:
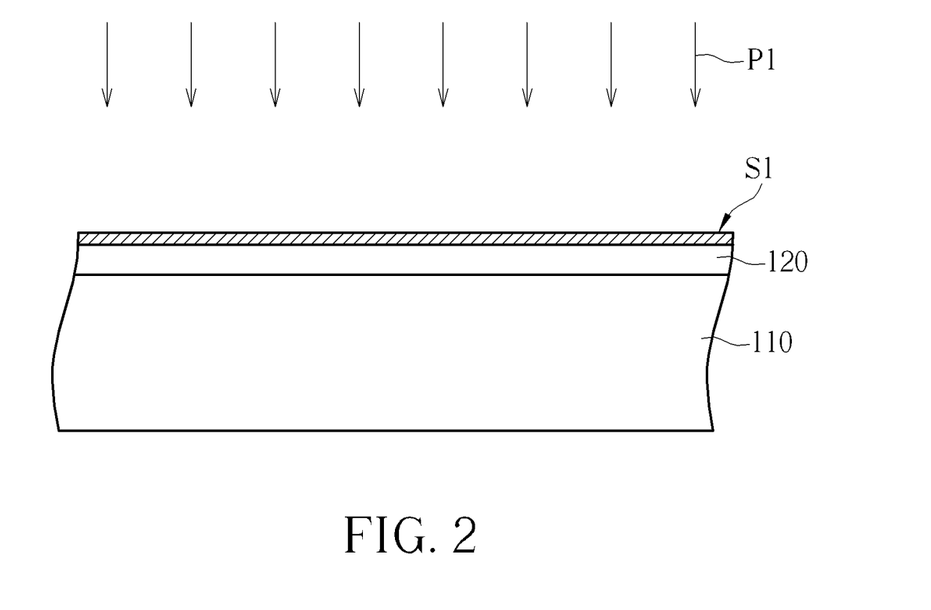

As shown in FIG. 2, a plasma applying treatment process P1 may be selectively performed on the dielectric layer 120. The plasma applying treatment process P1 may be a plasma nitridation process, but it is not limited thereto. In this embodiment, the plasma applying treatment process P1 is a decoupled plasma nitridation (DPN) process, which nitridizes a surface S1 of the dielectric layer 120, enabling the surface S1 of the dielectric layer 120 to contain nitrogen atoms without having them diffusing into the substrate 110, thereby avoiding the substrate 110 from being damaged by plasma, and increasing the reliability of the formed semiconductor structure.

Figure 3:
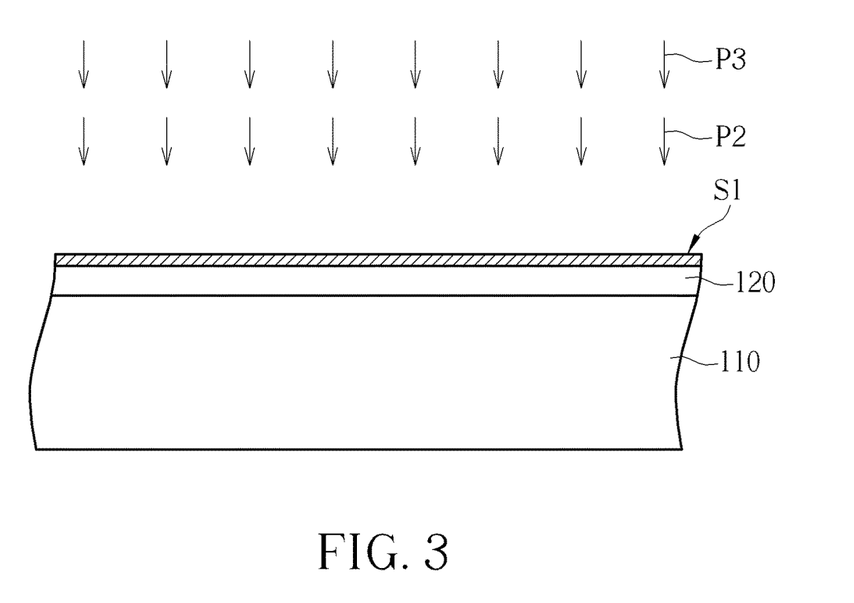

As shown in FIG. 3, a first annealing process P2 and a second annealing process P3 on the dielectric layer 120 are performed in-situly and consequently, wherein the first annealing process P2 and the second annealing process P3 have different imported gases and different annealing temperatures. By doing this, the surface of the substrate 110 or the dielectric layer 120 damaged by previous processes can be repaired effectively by performing the two annealing processes having different imported gases and different annealing temperatures. In a preferred embodiment, the first annealing process P2 and the second annealing process P3 are respectively a non-oxygen containing annealing process and an oxygen containing annealing process. In this embodiment, the first annealing process P2 and the second annealing process P3 are sequentially performed on the dielectric layer 120. Moreover, the imported gases of the first annealing process P2 comprise nitrogen gas, which is a non-oxygen containing annealing process, and the processing temperature is preferably comprised within 800° C.~1040° C., and the imported gases of the second annealing process P3 comprise oxygen gas, so it is an oxygen containing annealing process, and the processing temperature is preferably comprised within 600° C.~700° C., but it is not limited thereto. In a preferred embodiment, when the second annealing process P3 (i.e. an oxygen containing annealing process) is performed, the nitrogen gas is still imported, thereby preventing the dielectric layer 120 from being oxidized too quickly. In another embodiment, the imported gases of the first annealing process P2 comprise helium gas, hydrogen gas or other inert gases.

It is emphasized that, the first annealing process P2 and the second annealing process P3 are performed in-situly to repair the damages of the dielectric layer 120 and the substrate 110 and to densify the dielectric layer 120, so that the leakage current density (Jg) can be reduced. Specifically, the first annealing process P2 and the second annealing process P3 are performed in the same processing chamber. In this embodiment, the plasma nitridation process, the first annealing process P2 and the second annealing process P3 are performed in the same cluster tool to form the dielectric layer 120 without exposing it to the air. In another embodiment, the processing chamber for performing the plasma nitridation process, the first annealing process P2 and the second annealing process P3 may be the same as the processing chamber for forming the dielectric layer 120. Thus, time for changing different processing chambers for the annealing processes can be omitted. Specifically, prior art needed a pre-heating or heating time before achieving the annealing temperatures of each of the two annealing processes (the annealing temperatures of the first annealing process P2 is 800° C., and the annealing temperatures of the second annealing process P3 is 700° C.) because the dielectric layer 120 was transferred to different processing chambers when performing the two annealing processes, so that the annealing temperatures of the two annealing processes would be obtained progressively. In the semiconductor process of the present invention, the first annealing process P2 and the second annealing process P3 are performed in-situly, therefore a pre-heating or heating step of the second annealing process P3 is not needed anymore; that is, only one pre-heating or heating step is performed as the first annealing process P2 is performed, and then the annealing temperature of the second annealing process P3 can be directly obtained from the annealing temperature of the first annealing process P2. Thus, the processing time of the annealing processes can be shortened, and the dielectric layer 120 pollution from changing to different processing chambers between the annealing processes can be avoided.

Figure 4:
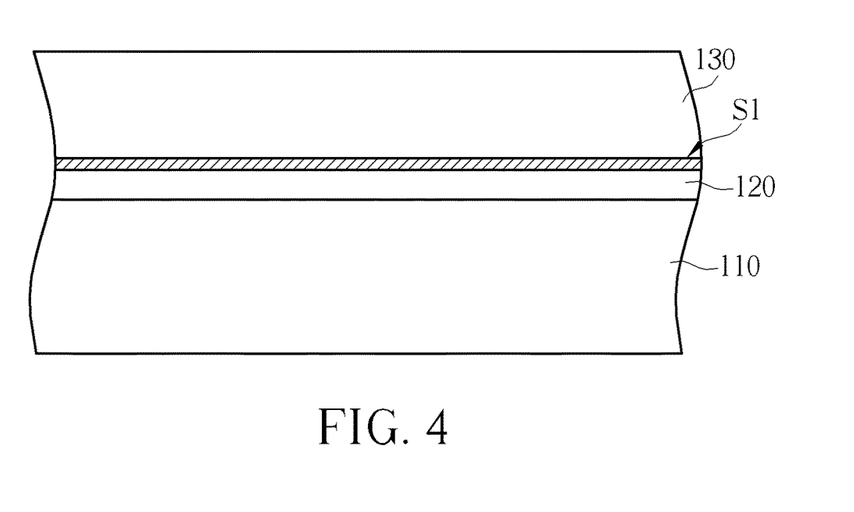

As shown in FIG. 4, a gate conductive layer 130 is formed on the dielectric layer 120. The gate conductive layer 130 and the dielectric layer 120 may be performed in the same cluster tool. This means that the gate conductive layer 130 can be formed in-situly on the dielectric layer 120 after the first annealing process P2 and the second annealing process P3 are performed without exposing the dielectric layer 120 to the air; but the processing chambers for forming the dielectric layer 120 and forming the gate conductive layer 130 are more likely different ones. In this embodiment, the gate conductive layer 130 is a silicon containing gate conductive layer such as a polysilicon gate conductive layer, and the semiconductor process of the present invention can be used to form a MOS transistor having a polysilicon gate, but it is not limited thereto.

Figure 11:
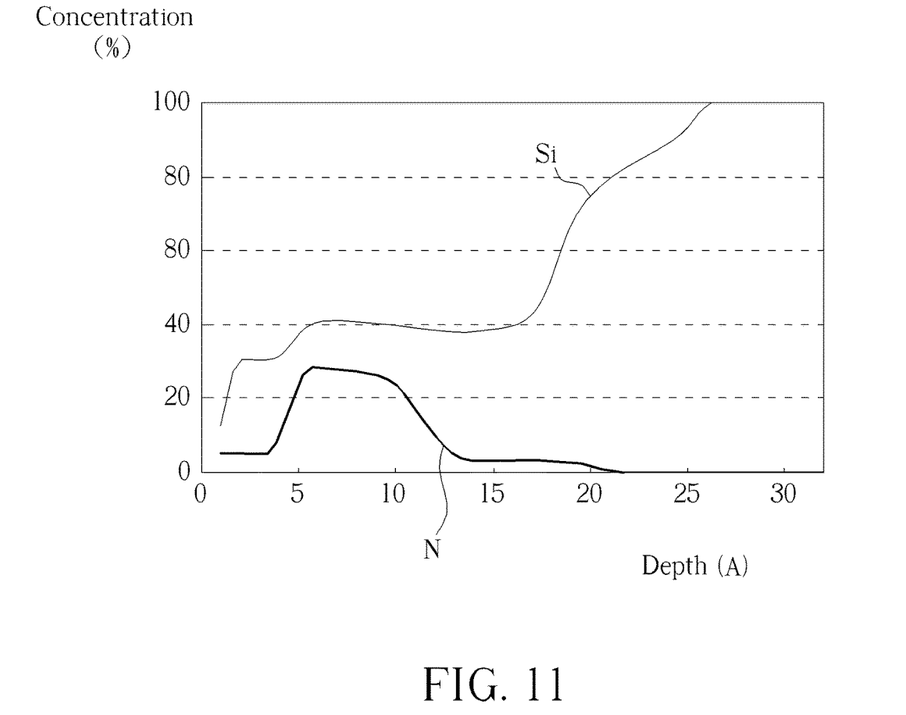
FIG. 11 schematically depicts a graph of the concentration of nitrogen and silicon atoms in a dielectric layer versus the depth of the dielectric layer according to an embodiment of the present invention.

Accordingly, the semiconductor structure of the present invention includes the dielectric layer 120 having nitrogen atoms, and the nitrogen atoms are concentrated on the surface S1, enabling the nitrogen atoms to be as far away from the substrate 110 as possible, thereby improving the reliability of the formed semiconductor structure. Thus, the concentration of the nitrogen atoms decreases dramatically as the distance of the location in the dielectric layer 120 to the surface S1 is increased. For example, the concentration of the nitrogen atoms in the dielectric layer is lower than 5% when the distance of the location in the dielectric layer to the substrate 110 is less than 20% of the thickness of the dielectric layer, as shown in FIG. 11. FIG. 11 schematically depicts a graph of the concentration of nitrogen and silicon atoms in a dielectric layer versus the depth of the dielectric layer according to an embodiment of the present invention. In FIG. 11 the thickness of the dielectric layer is about 18 angstroms, which corresponds to the location having its silicon content increasing dramatically, i.e. the location is the place where the dielectric layer contacts the substrate, and the concentration of the nitrogen atoms is lower 5% at a distance of 13 angstroms from the surface S1.

Moreover, the semiconductor process of the present invention can be applied to various semiconductor processes except for the polysilicon gate processes. An example of semiconductor process of the present invention using a gate last process for a buffer layer last and high-k last process is presented in the following, but the semiconductor process of the present invention is not restricted to be applied to it.

Figure 5:
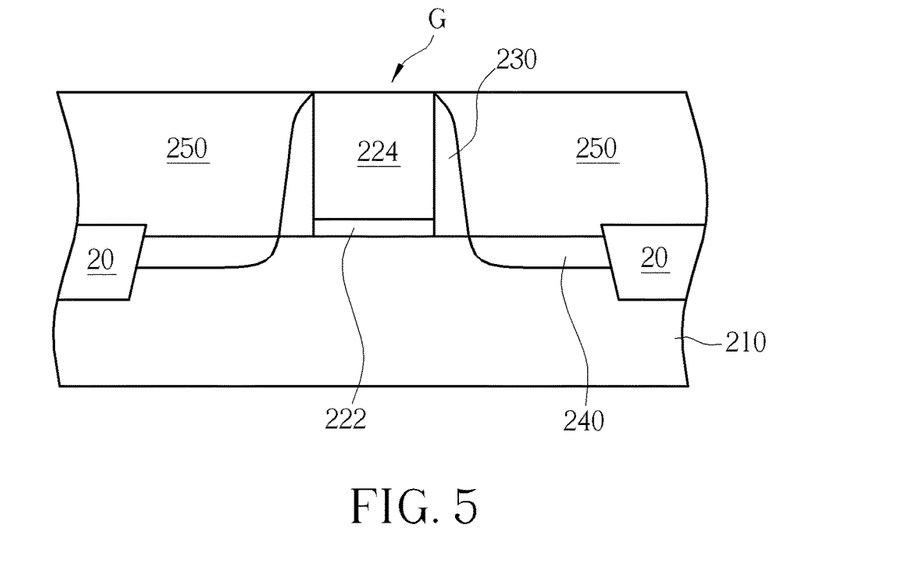
FIGS. 5-10 schematically depict cross-sectional views of a semiconductor process according to an embodiment of the present invention.

FIGS. 5-10 schematically depict cross-sectional views of a semiconductor process according to an embodiment of the present invention. As shown in FIG. 5, a substrate 210 is provided. The substrate 210 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. An isolation structure 20 is formed in the substrate 210 to electrically isolate each transistor. The isolation structure 20 may be a shallow trench isolation (STI) structure, which may be formed by a shallow trench isolation (STI) process, and the details are known in the art, so they are not described herein, but it is not limited thereto.

A gate dielectric layer (not shown), a sacrificial electrode layer (not shown) and a cap layer (not shown) are sequentially formed from bottom to top to cover the substrate 210. Then, the cap layer (not shown), the sacrificial electrode layer (not shown) and the gate dielectric layer (not shown) are patterned to form a gate dielectric layer 222, a sacrificial electrode layer 224 and a cap layer (not shown) on the substrate 210. This means that a sacrificial gate G including the gate dielectric layer 222, the sacrificial electrode layer 224 and the cap layer (not shown) is formed.

A spacer 230 is formed on the substrate 210 beside the sacrificial gate G. An ion implantation process is performed to automatically align and form a source/drain region 240 in the substrate 110 beside the spacer 230. The spacer 230 may be a single layer structure or a multilayer structure composed of silicon nitride or silicon oxide etc. The dopants of the source/drain region 240 may include trivalent ions or pentavalent ions such as boron or phosphorus, depending upon the electrical type of the formed semiconductor component. A salicide process may be selectively performed to form a metal silicide (not shown) on the source/drain region 240. A contact etch stop layer (CESL) may be selectively and entirely formed on the sacrificial gate G, the spacer 230 and the substrate 210. Optionally, a liner may be formed and a lightly-doped ion implantation process may be performed to form a lightly-doped source/drain region (not shown) before the ion implantation process is performed to form the source/drain region 240.

Figure 6:
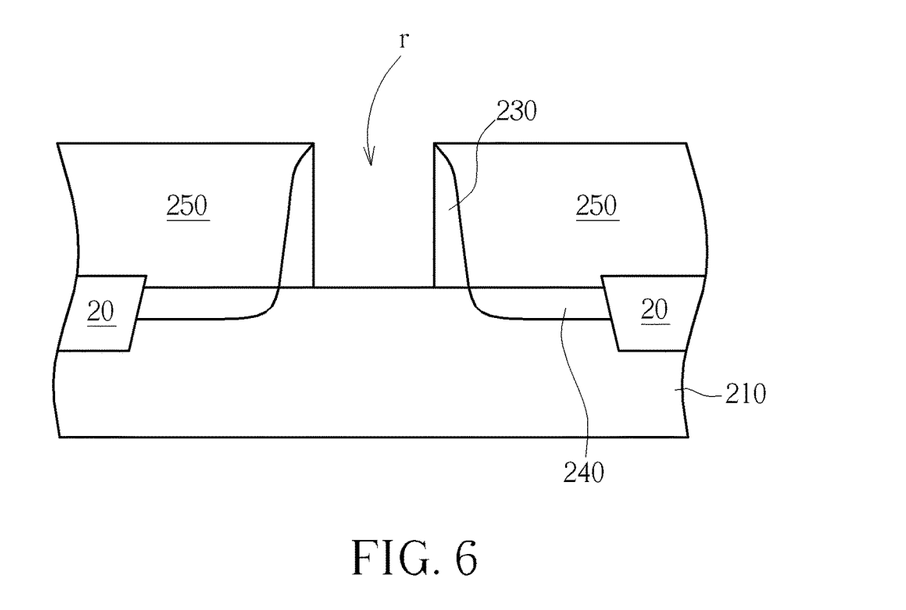

An interdielectric layer (not shown) is formed to entirely cover the substrate 210 and the sacrificial gate G, and then the interdielectric layer (not shown) is planarized until the contact etch stop layer (CESL) (not shown) and the cap layer (not shown) on the sacrificial electrode layer 224 are removed and the sacrificial electrode layer 224 is exposed, thereby meaning that an interdielectric layer 250 is formed and the sacrificial electrode layer 224 is exposed. Then, the sacrificial electrode layer 224 and the gate dielectric layer 222 are removed, so that a recess r is therefore formed and the substrate 210 is exposed as shown in FIG. 6.

Figure 7:
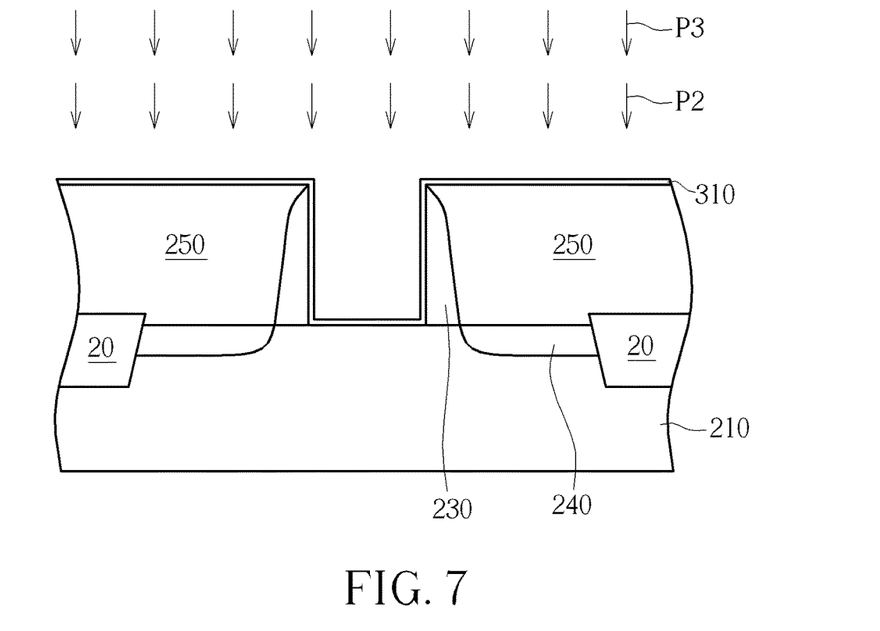

As shown in FIG. 7, a buffer layer 310 is formed to entirely cover the substrate 210, the spacer 230 and the interdielectric layer 250. The buffer layer 310 may be an oxide layer, which may be formed through a thermal oxide or chemical oxide process, but it is not limited thereto. In this embodiment, the buffer layer 310 is formed by an in situ steam generated (ISSG) process. Then, the semiconductor process of the present invention may be selectively performed to improve the electrical performances of the buffer layer 310. This means that a plasma nitridation process (not shown) may be performed, then the first annealing process P2 and the second annealing process P3 having different imported gases and different annealing temperatures are performed on the buffer layer 310 to repair the buffer layer 310 and the substrate 110 damaged by previous processes and to reduce the leakage circuit density (Jg). For example, the first annealing process P2 may be performed on the buffer layer 310 after the plasma nitridation process is performed, wherein the first annealing process P2 may be a non-oxygen containing annealing process imported nitrogen gas, and the annealing temperature is preferred to be comprised within 800° C.~1040° C.; then, the second annealing process P3 is performed on the buffer layer 310, wherein the second annealing process P3 may be an oxygen containing annealing process imported oxygen gas, and the annealing temperature is preferred to be comprised within 600° C.~700° C., but it is not limited thereto.

It is emphasized that, the first annealing process P2 and the second annealing process P3 are performed in-situly in the same processing chamber. Specifically, the plasma nitridation process, the first annealing process P2 and the second annealing process P3 are performed in the same cluster tool to form the buffer layer 310 without exposing it to the air. By doing this, time for transferring to different processing chambers for the annealing processes can be omitted. Specifically, prior art used to need a pre-heating or heating time before achieving the annealing temperatures of each of the two annealing processes (the annealing temperatures of the first annealing process P2 is 800° C., and the annealing temperatures of the second annealing process P3 is 700° C.) because the buffer layer 310 had to be moved to different processing chambers between performing the two annealing processes, so that the annealing temperatures of the two annealing processes can be achieved progressively. As the semiconductor process of the present invention, i.e. performing the first annealing process P2 and the second annealing process P3 in-situly, is applied, a pre-heating or heating step for the second annealing process P3 is not needed; that is, only one pre-heating or heating step is performed as the first annealing process P2 is performed, and then the annealing temperature of the second annealing process P3 can be directly achieved from the annealing temperature of the first annealing process P2. Thus, the processing time of the annealing processes can be shortened, and the buffer layer 310 formed by the present invention will not be polluted because of the transfer to different processing chambers during the annealing processes.

Figure 8:
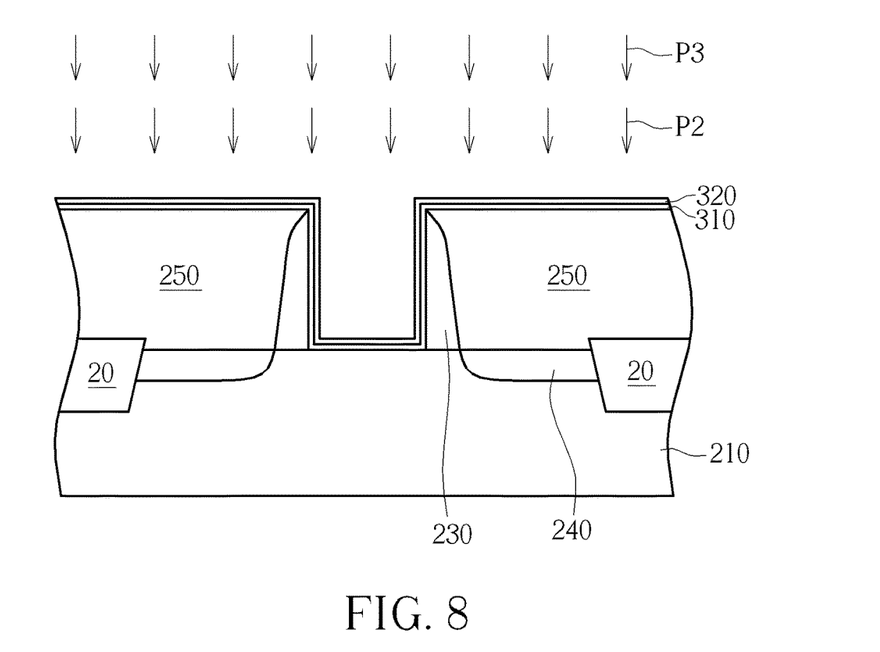

As shown in FIG. 8, a gate dielectric layer having a high dielectric constant 320 is formed to entirely cover the buffer layer 310, wherein the gate dielectric layer having a high dielectric constant 320 may be the group selected from hafnium oxide (HfO2), hafnium silicon oxide (HfSiO4), hafnium silicon oxynitride (HfSiON), aluminum oxide (Al2O3), lanthanum oxide (La2O3), tantalum oxide (Ta2O5), yttrium oxide (Y2O3), zirconium oxide (ZrO2), strontium titanate oxide (SrTiO3), zirconium silicon oxide (ZrSiO4), hafnium zirconium oxide (HfZrO4), strontium bismuth tantalite (SrBi2Ta2O9, SBT), lead zirconate titanate (PbZrxTi1-xO3, PZT) and barium strontium titanate (BaxSr1-xTiO3, BST).

Then, the semiconductor process of the present invention may be selectively performed to improve the electrical performances of the gate dielectric layer having a high dielectric constant 320. I.e. a plasma nitridation process (not shown) may be performed, then the first annealing process P2 and the second annealing process P3 having different imported gases and different annealing temperatures are performed on the gate dielectric layer having a high dielectric constant 320 to repair the gate dielectric layer having a high dielectric constant 320 damaged by previous processes, and reduce the leakage circuit density (Jg). For example, the first annealing process P2 may be performed on the gate dielectric layer having a high dielectric constant 320 after the plasma nitridation process is performed, wherein the first annealing process P2 may be a non-oxygen containing annealing process imported nitrogen gas, and the annealing temperature is preferred to be comprised within 800° C.~1040° C.; then, the second annealing process P3 is performed on the gate dielectric layer having a high dielectric constant 320, wherein the second annealing process P3 may be an oxygen containing annealing process imported oxygen gas, and the annealing temperature is preferred to be comprised within 600° C.~700° C., but it is not limited thereto.

It is emphasized that, the first annealing process P2 and the second annealing process P3 are performed in-situly in the same processing chamber. Specifically, the plasma nitridation process, the first annealing process P2 and the second annealing process P3 are performed in the same cluster tool to form the gate dielectric layer having a high dielectric constant 320 without exposing it to the air. By doing this, the time needed for changing the different processing chambers for the annealing processes can be omitted. Specifically, prior art needed a pre-heating or heating time before achieving the annealing temperatures of each of the two annealing processes (the annealing temperatures of the first annealing process P2 is 800° C., and the annealing temperatures of the second annealing process P3 is 700° C.) because the gate dielectric layer having a high dielectric constant 320 is transferred to different processing chambers between the two annealing processes, so that the annealing temperatures of the two annealing processes can be achieved progressively. When the semiconductor process of the present invention, i.e. performing the first annealing process P2 and the second annealing process P3 in-situly, is applied, a pre-heating or heating step of the second annealing process P3 is not needed; that is, only one pre-heating or heating step is performed before the first annealing process P2 is performed, and then the annealing temperature of the second annealing process P3 can be directly achieved from the annealing temperature of the first annealing process P2. Thus, the processing time of the annealing processes can be shortened, and the gate dielectric layer having a high dielectric constant 320 formed in the present invention will not be polluted by the transfer through different processing chambers for annealing processes.

Moreover, the semiconductor process of the present invention (i.e. the plasma applying treatment process P1 may be performed, then the first annealing process P2 and the second annealing process P3 are performed) can be performed just after the buffer layer 130 is formed or just after the gate dielectric layer having a high dielectric constant 320 is formed; or, can be performed not only after the buffer layer 130 is formed but also after the gate dielectric layer having a high dielectric constant 320 is formed depending upon the practical needs.

Figure 9:
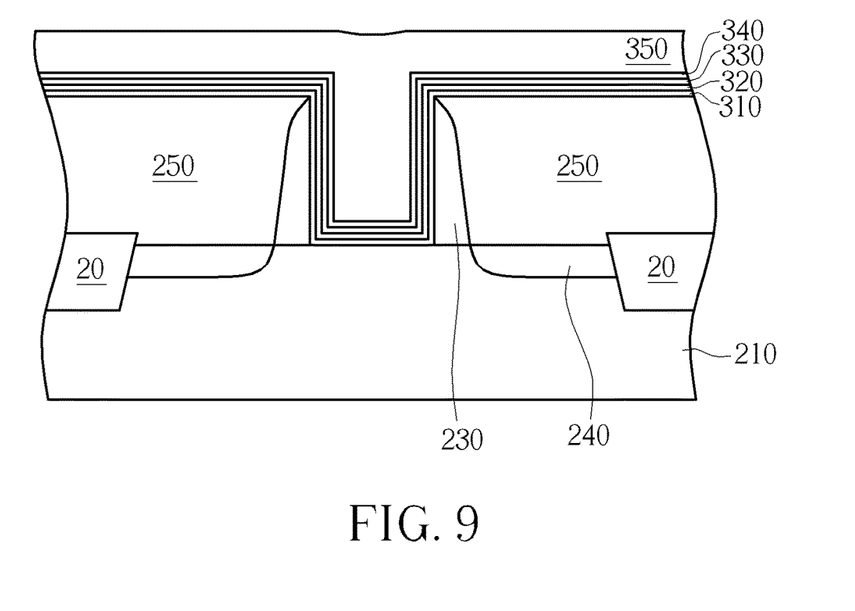

As shown in FIG. 9, a bottom barrier layer 330 may be selectively formed on the gate dielectric layer having a high dielectric constant 320 for preventing metals later formed thereon from diffusing downward and polluting the gate dielectric layer having a high dielectric constant 320. The bottom barrier layer 330 may be a single layer structure or a multilayer structure composed of tantalum nitride (TaN) or titanium nitride (TiN) etc. A work function layer 340 is formed to cover the bottom barrier layer 330. The work function layer 340 may be an aluminum titanium layer or a titanium nitride layer etc, depending upon the electrical type of formed semiconductor structures, such as transistors, but it is not limited thereto. A top barrier layer (not shown) may be selectively formed on the work function layer 340. The top barrier layer (not shown) may be a titanium nitride layer used for preventing metals later formed thereon from diffusing downward and polluting the work function layer 340, the bottom barrier layer 330 or the gate dielectric layer having a high dielectric constant 320, so that problems of degraded electrical performances, such as a reduction of the work function value of transistors or an increase in the leakage circuit density can be avoided. A low resistivity material 350 is formed on the top barrier layer (not shown) or the work function layer 340. The low resistivity material 350 may be composed of aluminum or tungsten, etc.

Figure 10:
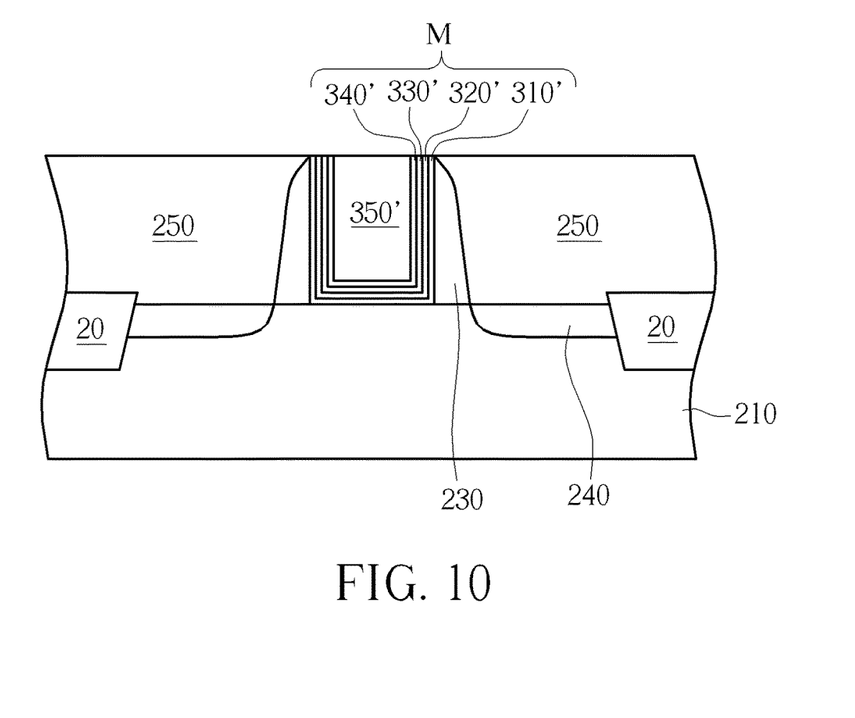

As shown in FIG. 10, a planarization process such as a chemical mechanical polishing (CMP) process may be performed until the interdielectric layer 250 is exposed and a metal gate M including a buffer layer 310', a gate dielectric layer having a high dielectric constant 320', a bottom barrier layer 330', a work function layer 340' and a low resistivity material 350' is formed.

Thereafter, later semiconductor processes may be performed. For example, a top interdielectric layer (not shown) may be selectively formed on the interdielectric layer 250, and a plurality of contact holes (not shown) may be formed in the top interdielectric layer (not shown) and the interdielectric layer 250, leading the source/drain region 240 (or the metal silicide) to be exposed. Then, contact plugs (not shown) may be formed by filling metals such as tungsten or copper, or etc, into the contact holes (not shown), to electrically connect the source/drain region 240 to other outer semiconductor components. At the same time, contact plugs (not shown) are formed on the metal gate M to electrically connect the metal gate M to other outer semiconductor components.

An example of semiconductor process of the present invention using a gate last process for a buffer layer first and high-k first process is presented in the following, but the semiconductor process of the present invention is not restricted to be applied to it.

Figure 12:
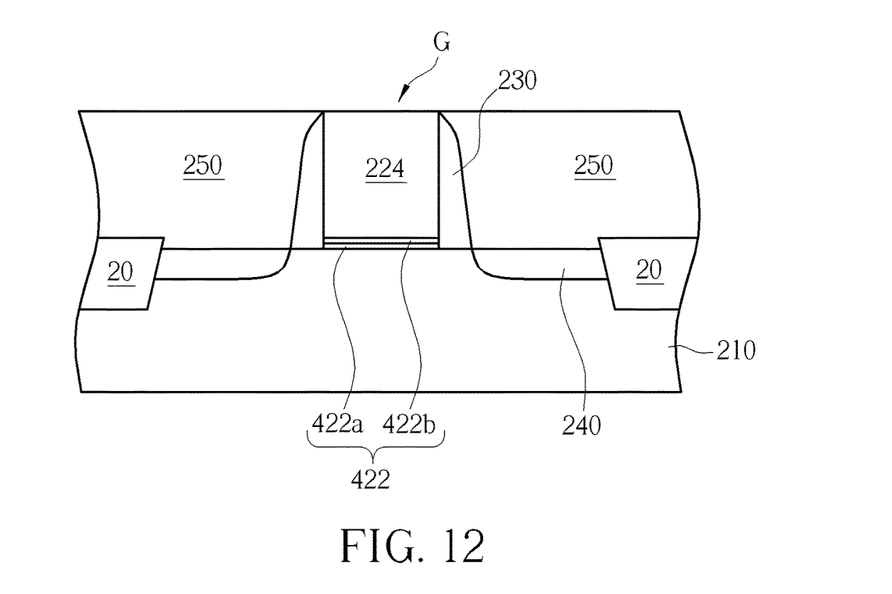
FIGS. 12-14 schematically depict cross-sectional views of a semiconductor process according to an embodiment of the present invention.
Figure 13:
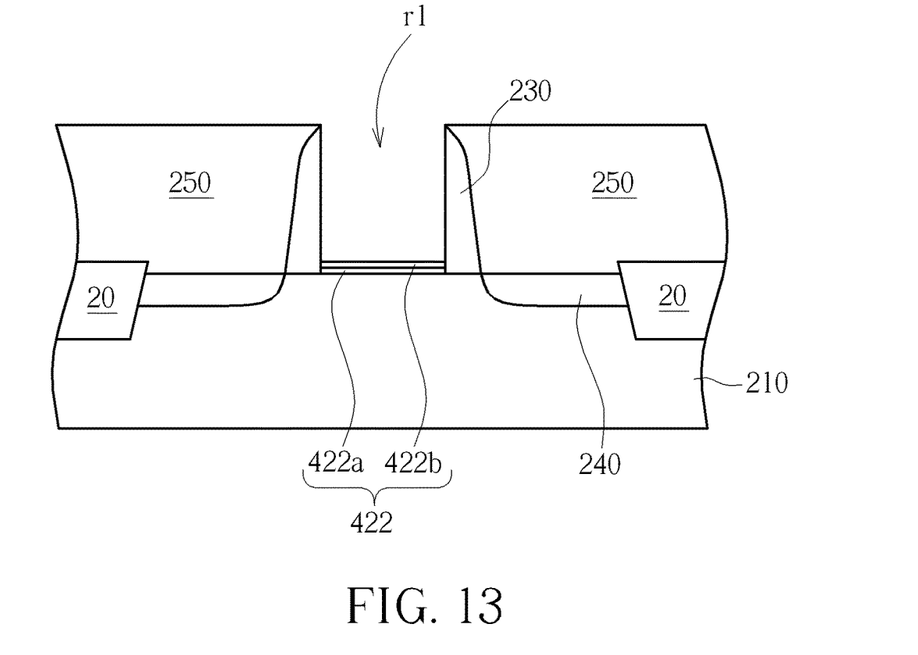
Figure 14:
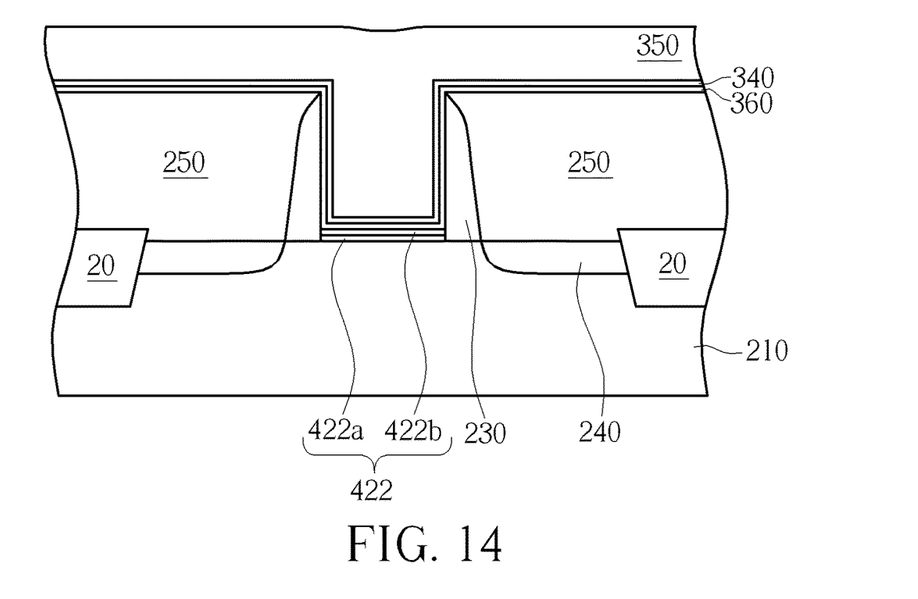

FIGS. 12-14 schematically depict cross-sectional views of a semiconductor process according to an embodiment of the present invention. As shown in FIG. 12, the structure in this embodiment is similar to the structure shown in FIG. 5. The merely difference is: the gate dielectric layer 222 shown in FIG. 5 is replaced by a gate dielectric layer 422 including a buffer layer 422a and a gate dielectric layer having a high dielectric constant 422b from bottom to top due to a gate last process for a buffer layer first and high-k first process is presented in this embodiment, and the method of the present invention can be selectively applied to the buffer layer 422a and the gate dielectric layer having a high dielectric constant 422b. More precisely, after the buffer layer 422a or/and the gate dielectric layer having a high dielectric constant 422b are formed, the aforesaid first annealing process P2 and the aforesaid second annealing process P3 on the buffer layer 422a or/and the gate dielectric layer having a high dielectric constant 422b are performed in-situly and consequently, wherein the first annealing process P2 and the second annealing process P3 have different imported gases and different annealing temperatures. By doing this, the surface of the substrate 210, the buffer layer 422a and the gate dielectric layer having a high dielectric constant 422b damaged by previous processes can be repaired effectively by performing the two annealing processes having different imported gases and different annealing temperatures. The processing parameters in the present invention such as imported gases and preferred processing temperatures, the achievement capabilities and the materials of the buffer layer 422a and the gate dielectric layer having a high dielectric constant 422b are illustrated in previous embodiments, and are not described again. A bottom barrier layer (not shown) may be selectively formed between the gate dielectric layer having a high dielectric constant 422b and the sacrificial electrode layer 224 to prevent metals later formed thereon from diffusing downward and therefore polluting the gate dielectric layer having a high dielectric constant 422b.

Then, the sacrificial electrode layer 224 is removed so that a recess r1 is formed while the gate dielectric 422 is exposed as shown in FIG. 13. As shown in FIG. 14, a cap layer 360 may be selectively formed on the bottom barrier layer (not shown)/the gate dielectric layer having a high dielectric constant 422b for being as an etch stop layer, wherein the material of the cap layer 360 may be tantalum nitride or etc. A work function layer 340 is formed to cover the cap layer 360. A top barrier layer (not shown) may be selectively formed on the work function layer 340 for preventing metals later formed thereon from diffusing downward and polluting the work function layer 340, the cap layer 360 or the gate dielectric layer having a high dielectric constant 422b, so that problems of degraded electrical performances, such as a reduction of the work function value of transistors or an increase in the leakage circuit density can be avoided. A low resistivity material 350 is formed on the top barrier layer (not shown) or the work function layer 340. The materials of the bottom barrier layer (not shown), the work function layer 340, the top barrier layer (not shown) or the low resistivity material 350 are illustrated in previous embodiment, and are not described again.

Then, a planarization process such as a chemical mechanical polishing (CMP) process may be performed until the interdielectric layer 250 is exposed and a metal gate (not shown) is formed. Thereafter, later semiconductor processes may be performed. For example, a top interdielectric layer (not shown) may be selectively formed on the interdielectric layer 250, and a plurality of contact holes (not shown) may be formed in the top interdielectric layer (not shown) and the interdielectric layer 250, leading the source/drain region 240 (or the metal silicide) to be exposed. Then, contact plugs (not shown) may be formed by filling metals such as tungsten or copper, or etc, into the contact holes (not shown), to electrically connect the source/drain region 240 to other outer semiconductor components. At the same time, contact plugs (not shown) are formed on the metal gate (not shown) to electrically connect the metal gate (not shown) to other outer semiconductor components.

To summarize, the present invention provides a semiconductor structure and a process thereof, which performs a first annealing processes and a second annealing processes on a dielectric layer in-situly, and the two annealing processes have different imported gases and different annealing temperatures. In this way, the dielectric layer and a substrate can be repaired effectively by performing the two annealing processes having different imported gases and different annealing temperatures, and the circuit leakage density (Jg) is therefore reduced. Moreover, only one single pre-heating or heating step is performed as the two annealing processes having different imported gases and different annealing temperatures are performed, thereby reducing the processing time of the two annealing processes. Besides, the dielectric layer of the present invention will not be polluted because of transfers to different processing chambers between the two annealing processes.

Furthermore, the dielectric layer of the present invention may be a dielectric layer of a polysilicon gate, or a buffer layer or a gate dielectric layer having a high dielectric constant of a metal gate etc. The first and the second annealing process of the present invention may include sequentially performing a non-oxygen containing annealing process and an oxygen containing annealing process, wherein nitrogen gas, hydrogen gas, helium gas or inert gases may be imported during the non-oxygen containing annealing process, while oxygen gas may be imported during the oxygen containing annealing process. Moreover, a plasma applying treatment process may be performed on the dielectric layer before the annealing processes are performed, so as to dope and concentrate dopants near the surface of the dielectric layer, thereby adjusting the material properties of the dielectric layer without polluting the substrate.

Accordingly, the semiconductor structure formed by the semiconductor process of the present invention has a dielectric layer including nitrogen atoms, and the concentration of the nitrogen atoms in the dielectric layer is lower than 5% at a location wherein the distance between the location in the dielectric layer to the substrate is less than 20% of the thickness of the dielectric layer. Therefore, pollution and damage in the substrate caused by the plasma or the dopants can be reduced, and the reliability of the formed semiconductor structure can be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor process, comprising:
forming a dielectric layer comprising a buffer layer and a gate dielectric layer having a high dielectric constant on a substrate; and
in-situ performing two annealing processes after the buffer layer is formed, and then in-situ performing the two annealing processes after the gate dielectric layer having the high dielectric constant is formed respectively, wherein the two annealing processes use different imported gases and have different annealing temperatures, the two annealing processes comprise a non-oxygen containing annealing process and an oxygen containing annealing process, and the annealing temperature of the non-oxygen containing annealing process is larger than the annealing temperature of the oxygen containing annealing process, wherein the imported gases of the non-oxygen containing annealing process comprise hydrogen gas and nitrogen gas.

2. The semiconductor process according to claim 1, wherein the dielectric layer comprises a silicon oxide layer, a silicon oxynitride layer or a hafnium oxide layer.

3. The semiconductor process according to claim 1, wherein the dielectric layer is formed by an In Situ Steam Generated (ISSG) process.

4. The semiconductor process according to claim 1, wherein the annealing temperature of the non-oxygen containing annealing process is between 800° C.-1040° C.

5. The semiconductor process according to claim 1, wherein the imported gases of the oxygen containing annealing process comprise oxygen gas.

6. The semiconductor process according to claim 5, wherein the annealing temperature of the oxygen containing annealing process is between 600° C.-700° C.

7. The semiconductor process according to claim 1, wherein the steps of performing the two annealing processes comprise: sequentially performing the non-oxygen containing annealing process and the oxygen containing annealing process.

8. The semiconductor process according to claim 1, wherein the non-oxygen containing annealing process and the oxygen containing annealing process are performed in the same processing chamber.

9. The semiconductor process according to claim 1, further comprising:

performing a plasma applying treatment process on the dielectric layer before the two annealing processes are performed.

10. The semiconductor process according to claim 9, wherein the plasma applying treatment process comprises a decoupled plasma nitridation (DPN) process.

11. The semiconductor process according to claim 1, further comprising:
forming a gate conductive layer on the dielectric layer after the two annealing processes are performed.

12. The semiconductor process according to claim 11, wherein the gate conductive layer and the dielectric layer are formed in the same cluster tool.

\* \* \* \* \*